United States Patent [19]

Cline et al.

[11] 4,163,983

[45] Aug. 7, 1979

[54] SOLID STATE NEURON

[75] Inventors: Harvey E. Cline; Thomas R. Anthony; Ivar Giaever, all of Schenectady, N.Y.

[73] Assignee: General Electric Company, Schenectady, N.Y.

[21] Appl. No.: 946,609

[22] Filed: Sep. 28, 1978

[51] Int. Cl.² ............................................. H01L 29/88
[52] U.S. Cl. ......................................... 357/12; 357/60; 307/201
[58] Field of Search ..................... 357/12, 60; 307/201

[56] References Cited
U.S. PATENT DOCUMENTS 3,333,118   7/1967   Cote ....................................... 357/12

Primary Examiner—Edward J. Wojciechowicz
Attorney, Agent, or Firm—Donald M. Winegar; Joseph T. Cohen; Leo I. MaLossi

[57] ABSTRACT

A semiconductor neuron comprises a tunnel diode having a region of recrystallized semiconductor material formed in situ in a columnar structure body of semiconductor material by thermal gradient zone melting. Individual electrical leads are affixed to the body and to both opposing faces of the recrystallized region. A voltage pulse applied between one pair of electrical leads on one surface across the P-N junction will propagate at a predetermined rate through the semiconductor body. After a predetermined delay, the applied pulse will appear across the P-N junction thereby mimicking the conducting nerve pulses by a biological nerve cell and its nerve fiber.

10 Claims, 6 Drawing Figures

U.S. Patent  Aug. 7, 1979  4,163,983
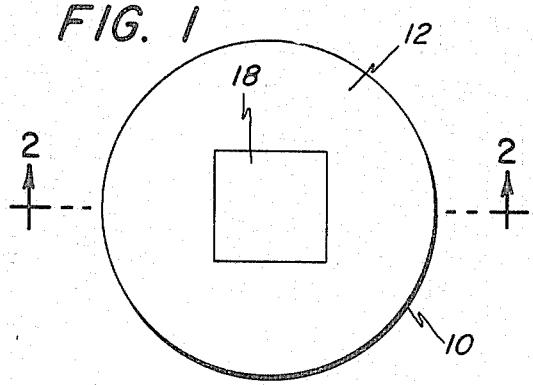
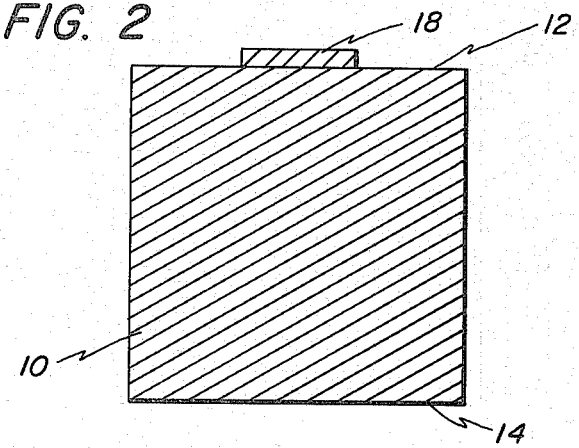
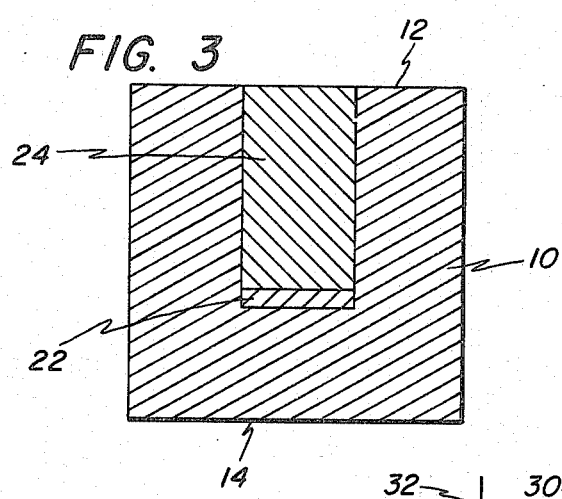
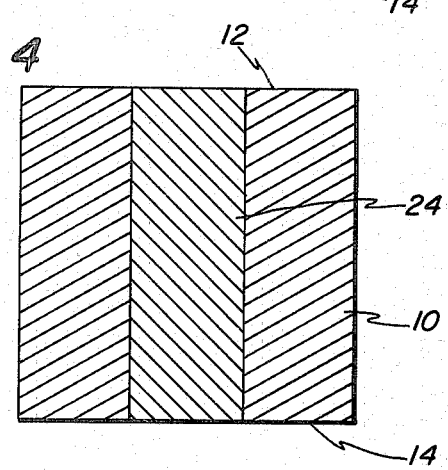
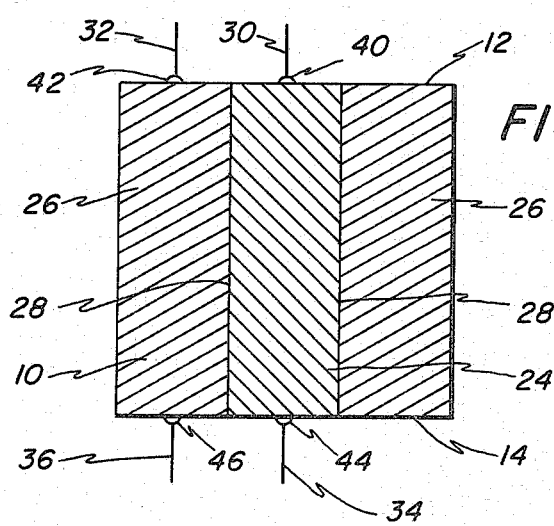
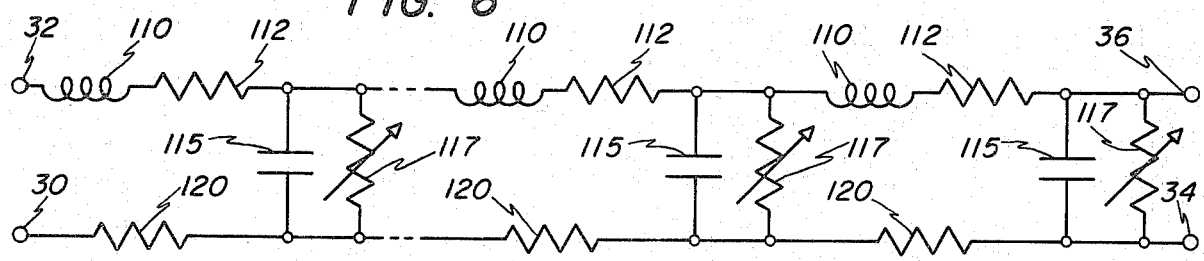

SOLID STATE NEURON

BACKGROUND OF THE INVENTION

1. Field of the Invention

This invention relates to a semiconductor neuron that mimics the operation of a biological nerve cell and nerve fiber.

2. Background of the Invention

A biological nerve fiber in an animal structurally resembles a coaxial cable. The nerve fiber has an inner central core of an electrically conducting axoplasm surrounded by a thin membrane sheath and is immersed in the electrically conductive body fluids of the animal. All nerve cells and nerve fibers having a reating potential of 60-100 millivolts applied across the thin membrane sheath between the inner axoplasm core and surrounding body fluids. This resting potential is in a direction such that the inner axoplasm core is negatively charged with respect to the surrounding fluids and can be measured by penetrating the membrane sheath with a miroelectrode and measuring the potential difference between the inner axoplasm core and the surrounding body fluids.

The membrane sheath of the nerve fiber normally acts as an insulating barrier while a nerve is resting. However, when the nerve is conducting nerve pulses, the membrane sheath actively responds to a depolarizing current (that is, a current that flows in a direction so as to eliminate the potential difference between the inner axoplasm core and the surrounding body fluids). For depolarizing currents above a critical threshold, typically $10^{-6}$ to $10^{-3}$ amps/cm$^2$, the axon membrane actively increases the depolarizing current and adds to the original stimulus current. In other words, the membrane above a critical threshold depolarizing current acts as a differential negative resistor like a tunnel diode and actively assists depolarizing. In contrast, the membrane does not make any active response to a hyperpolarizing current (that is, a current that flows in a direction so as to increase the potential difference between the inner axoplasm core and the surrounding body fluids).

If a nerve is stimulated at one end by causing a depolarizing current greater than the critical threshold current to flow through the membrane sheath at the point of stimulus, the resistance of the membrane will decrease rapidly at this point allowing more current to pass through the membrane. This current will change the potential of the inner axoplasm core of the nerve at the point of stimulus. The change in potential will generate a flow of current in the axoplasm core away from the stimulus point along the inner core of the nerve fiber. As the current flows away from the stimulus point along the inner core, the current is gradually diverted through the surrouunding membrane sheath and flows in a reverse direction through the surrounding body fluids back to the stimulus point. Here it again flows through the active membrane assisting the depolarizing current flow into the inner core and completing the current circuit. The area of the membrane actively boosting the depolarizing current spreads laterally along the axon as the depolarization current increases to the critical threshold in adjacent sections of the nerve fiber. At the same time at the original point of stimulus, the membrane which is acting like a capacitor discharging through a parallel differential negative resistance exhausts its ability to actively boost the depolarizing current which as a consequence decays at this point to zero. As a consequence of the differential negative resistance and the electrical capacitance of the membrane sheath of the nerve, a potential spike is formed which propagates away from the original stimulus point towards unstimulated sections of the nerve fiber. In this manner, a nerve pulse is conducted from one end of a nerve fiber to the other end.

An object of this invention is to provide a semiconductor neuron whose electrical properties will mimic those of a biological neuron.

Other objects of this invention will, in part, be obvious and will, in part, appear hereinafter.

BRIEF DESCRIPTION OF THE INVENTION

In accordance with the teachings of this invention there is provided a semiconductor neuron which functions in a manner similar to a biological neuron. The semiconductor neuron comprises a body of single crystal semiconductor material having two opposed major surfaces, a predetermined level of resistivity and a first type conductivity. At least one of the major surfaces has a preferred crystal planar orientation which is one selected from the group consisting of (100), (110) and (111). At least one first region of degenerative semiconductor material disposed in the body, and extends entirely through the body and terminates in the opposed major surfaces of the body. Each first region has two opposed end surfaces, each end surface being coextensive with a respective one of the two major opposed surfaces of the body and a second type conductivity. Each first region has a predetermined level of dopant impurity material which is substantially uniform throughout the entire region.

At least one second region of degenerative semiconductor material is disposed in, and extends entirely through, each first region to terminate in the two opposed end surfaces of the first region. Each second region has two opposed end surfaces, each end surface of the second region being coextensive with a respective end surface of the first region. The material of each second region is recrystallized semiconductor material of the first region and has a predetermined level of concentration of dopant impurity material which is substantially uniform throughout the entire second region. Each second region has a third type conductivity which is of opposite type conductivity to that of the first region.

A P-N junction is formed by the contiguous surfaces of the material of opposite type conductivity of each abutting pair of first and second regions. Each P-N junction extends between, and terminates in, the two opposed major surfaces of the body. The predetermined level of concentration of impurity material in each abutting pair of first and second regions is of a value sufficient to impart the electrical characteristics of a tunnel diode to the P-N junction disposed therebetween.

First and second ohmic electrical contacts are affixed to the respective end surfaces of the first and second regions which are coextensive with each other. Third and fourth ohmic electrical contacts are affixed to the respective end surfaces of the other respective end surfaces of the first and second regions which are also coextensive with each other.

When a voltage pulse is applied across the P-N junction between the first and second electrical contacts, the applied voltage pulse appears across the P-N junction between the third and fourth electrical contacts after a predetermined time delay.

The solid state neuron device functions to mimic the conducting nerve pulses of a biological nerve cell and its nerve fiber.

DESCRIPTION OF THE DRAWINGS

FIG. 1 is a top planar view of a body of semiconductor material being processed in accordance with the teachings of this invention;

FIG. 2 is an elevation view, in cross-section, of the body of FIG. 1 taken along the cutting plane II—II;

FIGS. 3 and 4 are elevation views, in cross-section, of the bodies of FIGS. 1 and 2 being processed further in accordance with the teachings of this invention;

FIG. 5 is an elevation view in cross-section of the semiconductor neuron made in accordance with the teachings of this invention;

FIG. 6 is the equivalent electrical circuit of the semiconductor neuron.

DESCRIPTION OF THE INVENTION

With reference to FIGS. 1 and 2, there is shown a body 10 of semiconductor material having a first selected level of resistivity and first type conductivity. The body 10 has opposed major surfaces 12 and 14 which are the top and bottom surfaces respectively thereof. At least one of the major surfaces 12 and 14 has a preferred crystal planar orientation which is one selected from the group consisting of (100), (110) and (111). The semiconductor material comprising the body 10 may be silicon, germanium, a compound of a Group II element and a Group VI element and a compound of a Group III element and a Group V element. For purposes of illustration, the body 10 can be considered to be a single crystal ingot of N-type germanium. The body 10 has a vertical axis which is substantially perpendicular to the surfaces 12 and 14.

Normally the body 10, or at least one first region, has a wide distribution of atoms of dopant material that induces a first type conductivity and a first level of resistivity in the germanium. Generally, this first conductivity type will be opposite to the conductivity type of the recrystallized region to be produced by the migration of an alloy liquid droplet through the body 10 by thermal gradient zone melting.

The first step in the subject thermal migration process is to deposit on surface 12 in a preselected pattern a quantity of dopant material 18 that will impart to the N-type germanium a second P-type conductivity type and a second level of resistivity. An example of a dopant that works well with germanium is gallium and it will be used for purposes of illustration. Other P-type dopants include aluminum, indium and zinc.

An alternative to using a pure dopant deposit to form the liquid alloy droplet is to use a carrier droplet containing the desired dopant. (See patent application Ser. No. 944,280 Anthony et al.) Carrier metals that work in germanium include lead, tin, gold, indium, silver, cadmium, thallium and zinc. Of these carrier metals, the most practical are tin, gold, and indium and alloys and combinations thereof, which can be processed at low temperatures to prevent broadening of the P-N junction. The most practical dopants to be added to these carrier metals are aluminum and gallium for P-type doping and arsenic for N-type doping because these impurities can heavily dope germanium enough to make it degenerate as the P-N junction formed by the migration droplet must have the characteristics associated with a tunnel diode in order for the semiconductor neuron to operate properly.

The preselected pattern of the deposit can be any pattern described within the limits of stability taught by Cline et al. in U.S. Pat. No. 3,899,361. However, as illustrated in FIG. 1, the preselected pattern is a simple square as would be chosen if surface 12 is a (100) plane. Table I lists the preferred geometry of the dopant deposit 18 for various ingot orientations and migration directions.

Table I

| Ingot Plane | Migration Direction | Preferred Geometry | Stable Size |
|---|---|---|---|
| (100) | <100> | square | <100μ |
| (110) | <110> | diamond | <100μ |
| (111) | <111> | triangular or hexagonal | <500μ |

Also given in Table I are the dopant pattern sizes which result in stable thermal migration.

Following deposition of the gallium on surface 12 of the N-type germanium, the gallium deposit may be sintered or alloyed to surface 12 of the germanium ingot. Sintering or alloying is beneficial inasmuch as the gallium-germanium melt formed subsequentially during thermal migration uniformly wets the germanium surface and assures excellent results.

Referring now to FIG. 3, the germanium ingot 10 with a deposited square of gallium is placed in suitable heating apparatus for practicing temperature gradient zone melting with the ingot or body 10 depicted in FIGS. 1 and 2 so that a unidirectional thermal gradient is established in the direction marked TG in FIG. 3, the thermal gradient being substantially parallel to the vertical axis of the body 10 and a preferred crystal axis of the material of the body 10. First, a gallium-rich melt 22 of germanium is formed on surface 12 as body 10 is heated above the gallium-germanium eutectic temperature of 29.8° C. This melt 22 begins to dissolve germanium on the hottest side thereof (that is, below it as viewed in FIG. 3). A unidirectional thermal gradient is established through the body 10 between the surface 12 and 14 and substantially parallel to, a preferred crystal axis of the material of the body 10. Alternately, the unidirectionally temperature gradient is established at a predetermined number of degrees off-axis of a preferred crystal axis of the material of the body 10. Concurrently, germanium begins to recrystallize on the coolest side of the melt (that is, above it as viewed in FIG. 3). Thus, the liquid melt 22 migrates up the temperature gradient into the interior of the ingot. (That is, in a downward direction in FIG. 3). Behind the liquid melt 22, a recrystallized region 24 of P-type germanium droped with gallium to the solid solubility limit is left behind.

The process is continued for a sufficient period of time and the liquid melt 22 emerges on the hot side 14 of the germanium ingot. The recrystallized material of the body 10 forms the P-type region 24 and extends through the entirety of the germanium ingot 10 and forms the P-N juntion 28 therebetween. The processing time depends on the ingot, or body 10, thickness, the temperature, the temperature gradient, which may be from 20° C./cm to 300° C./cm and the P-N type dopant comprising part of the alloy melt. For a germanium ingot of 2 cm thickness, a temperature of 900° C., a temperature gradient of 100° C./cm and a gallium-germanium melt, the processing time is about six hours. Other restrictions that will be listed later will restrict processing temperatures to lower temperatures than 900° C.

Following the above migration procedure, the ingot 10 is removed from the thermal migration processing apparatus and the solidified droplet is removed from surface 14 by lapping, etching or the like. The resulting processed ingot is shown schematically in FIG. 4.

Referring now to FIG. 5, a semiconductor neuron is formed from the processed ingot 10 illustrated in FIG. 4 by attaching ohmic electrical leads 30 and 32 by contacts 40 and 42 to the P-type region 24 and the N-type region 26, respectively, on surface 12. Ohmic electrical leads 34 and 36 are similarly attached to the P-type region 24 and the N-type region 26 by contacts 44 and 46, respectively, on surface 14.

The part of the semiconductor neuron analogous to the membrane sheath of the biological neuron is the P-N junction 28. In order that the P-N junction 28 of the semiconductor neuron have the differential negative resistance exhibited by the membrane sheath of the biological neuron, the P-N junction 28 must have the electrical characteristics of a tunnel diode. In order that the P-N junction 28 have tunnel diode characteristics, both the P-type and N-type regions must be degenerate. For germanium, this requires that the P-dopant and N-dopant concentrations be greater than $2 \times 10^{19}$ atoms/cm$^3$, making high solubility N-type impurities such as phosphorous and arsenic and high solubility P-type impurities such as aluminum and gallium the most practical dopants for germanium.

The tunneling current of a tunnel diode varies exponentially with the negative of the junction barrier width. Since it is the tunnel current phenomenon that gives rise to the differential negative resistance that is required by the semiconductor neuron, it is advantageous to have a small barrier width to maximize the tunneling current. Consequently, a step type P-N junction is necessary.

Both diffusion and epitaxial growth result in graded P-N junctions that are too wide for tunnel diodes. In contrast, doping by thermal migration at relatively low temperature results in a step junction of the type required by a tunnel diode. However, even in the case of thermal migration, the migration temperature and time must be carefully selected to avoid the broadening of the P-N junction that would decrease the tunneling current. In fact, once a dopant or a carrier metal-dopant combination has been chosen, the freedom in selecting an alloy temperature and time is limited.

For purposes of illustration, consider germanium requiring a doping density in excess of $2 \times 10^{19}$ atoms/cm$^3$ for tunneling. The germanium body may be doped N-type during crystal growth with arsenic to a level of $10^{20}$ atoms/cm$^3$. Using a gallium-rich alloy droplet, the germanium may be P-doped with $2 \times 10^{20}$ atoms/cm$^3$ at temperatures as low as 120° C. with processing by thermal gradient zone melting. If processing is carried out at 300° C., the maximum processing time before diffusion broadening of the junction begins to degrade the desired tunneling characteristics in about ten days. With a temperature gradient of 200° C./cm, the gallium-rich droplet migrates and forms a P-doped recrystallized zone 1 cm in length in this time period. Under these conditions, the maximum length of a semiconductor neuron is approximately 1 cm.

Table II gives the time limits for the migration process by thermal gradient zone melting required to prevent diffusion broadening of the P-N junction ($\sqrt{Dt} \leq 20 \text{A}°$) for various temperatures for a gallium liquid droplet migrating through a germanium ingot.

Table II

| Temperature (°C.) | Time limit (seconds) | Maximum-neuron length (cm) |
|---|---|---|
| 100 | $10^8$ | ↑ |
| 200 | $10^7$ | greater than 1cm |
| 300 | $10^6$ | 1cm |
| 400 | $10^5$ | ↑ |
| 500 | $10^4$ | ↑ |
| 600 | $10^3$ | less than 1cm |
| 700 | $10^2$ | ↓ |
| 800 | $10^1$ | ↓ |
| 900 | 1 | ↓ |

Referring now to FIG. 5, electrical contacts 40 and 44 affixed to the P-type region comprise an alloy of indium or tin containing greater than two atomic percent Ga or As. Electrical contacts 42 and 46 affixed to the N-type germanium comprise an alloy of In or tin containing greater than two atomic percent antimony. All electrical contacts are formed by alloying at the lowest practical temperature to minimize diffusional broadening. For a tin alloy, the minimum alloying temperature is approximately 230° C. The minimum alloying temperature for an indium alloy is about 160° C.

Referring now to FIG. 6, the equivalent electrical circuit of either a biological neuron or a semiconductor neuron is shown. Inductance 110 represents the inductance per unit length of the biological neuron or columnar semiconductor neuron arising from the coaxial geometry of both types of neurons. Resistance 112 in the case of a biological neuron represents the equivalent resistance per unit length of the body fluids surrounding the nerve fiber. In the case of a semiconductor neuron made form a N-type germanium ingot with a P-type columnar region, resistance 112 represents the equivalent resistance per unit length of the N-type region parallel to the columnar P-type region. Resistance 120 in the case of a biological neuron represents the equivalent resistance per unit length of the axoplasm of the nerve fiber. In the case of the semiconductor neuron, resistance 120 represents the resistance per unit length of the P-type region parallel to its own columnar axis. In the case of the biological neuron, capacitance 115 represents the capacitance per unit area associated with the membrane sheath of the nerve fiber. For the semiconductor neuron, capacitance 115 is the forward capacitance per unit area of the P-N junction. Variable resistance 117 represents the ability of the membrane sheath of the biological neuron to change its resistance per unit area when stimulated by a potential above a critical threshold. Similarly, variable resistance 117 represents the variable forward resistance per unit area associated with the tunnel diode characteristics of the P-N junction of the semiconductor neuron.

Because the semiconductor neuron has an equivalent electrical circuit that is functionally the same as the equivalent electrical circuit of the biological neuron, the semiconductor neuron will transmit pulses when given a stimulus potential in accordance with the transmission cable equation well known to those skilled in the art.

From the transmission cable equation, certain properties of the pulse shape and pulse transmission speed are known. The spatial width of the traveling pulse in the case of germanium semiconductor neuron of the type used for illustrating purposes is about $7 \times 10^{-2}$ cm for a P-type region of $2.5 \times 10^{-3}$ cm in diameter and a specific resistivity of $10^{-3}$ ohm-centimeters.

For comparison, the spatial width of a pulse in a typical biological neuron is about $10^{-1}$ cm.

The pulse width traveling in the semiconductor neuron is proportional to the square root of the diameter of the P-type region and inversely proportional to the square root of the specific resistivity of the P-type region.

The transmission speed of the pulse along a semiconductor neuron is proportional to the square root of the diameter of the P-type columnar region and inversely proportional to the square root of the specific resistivity of the P-type region and forward capacitance of the P-N junction. For a large N-type germanium ingot with a high conductivity (about $10^{-3}$ ohms-cm), the transmission speed of a pulse is about $3 \times 10^8$ cm/sec. for a P-type region of $5 \times 10^{-3}$ in diameter and with a specific resistivity of $10^{-3}$ ohm-cm operating initially in the forward biases region where the minority carrier diffusion capacitance of the junction is $10^{-3}$ pico farads/cm$^2$ and about $10^4$ cm/sec when operating initially in the reversed bias region with a junction capacitance of $10^4$ pico farads/cm$^2$. For sake of comparison, the pulse speed in a biological neuron is about $10^3$ cm/sec.

The propagation of a pulse along the semiconductor neuron is caused by the differential negative resistance associated with the tunnel diode characteristics of the P-N junction. In the active stimulated area of the junction, the effective resistance of the junction is smaller than the effective resistance of the rest of the junction. Thus when a portion of the junction is stimulated by a potential pulse, the adjacent portion of the P-N junction is thrown into a higher conduction made by the restimulating effect of the local current circuit parallel to and across the P-N junction in response to potential changes. By a repetition of this process of stimulation by the local circuit, the pulse spreads indefinitely on both sides of the site of initial stimulation.

Many modifications and variations of the above teachings will be obvious to those skilled in the art. For example, a semiconductor neuron network can be made by migrating an array of liquid alloy droplets through a semiconductor body and by interconnecting the array. Further, individual semiconductor neurons may be manufactured by the practicing of two thermal migrations in a body 10. A first region of recrystallized degenerative semiconductor material is formed in the body 10. Then the second region of recrystallized degenerative semiconductor material of opposite type conductivity is formed in the first region by thermal gradient zone melting processing.

The unidirectional thermal gradient may be established substantially parallel to preferred crystal axis of the material of the body, or alternately, at from 2° to 10° off-axis of the same crystal axis. The off-axis component may be obtained by deliberately cutting the wafers at an off-axis component so that when the unidirectional thermal gradient is established perpendicular to the opposed major surfaces, migration will naturally occur along the off-axis component.

We claim as our invention:

1. A semiconductor neuron comprising
   a body of single crystal semiconductor material having two opposed major surfaces, at least one of the major surfaces having a preferred crystal planar orientation, a predetermined level of resistivity and a first type conductivity;
   at least one first region of degenerative semiconductor material disposed in the body, extending entirely through the body and terminating in the opposed major surface of the body and having two opposed end surfaces, each end surface being coextensive with a respective one of the two major surfaces of the body;
   each first region having a predetermined level of concentration of dopant impurity material and a second type conductivity;
   at least one second region of degenerative semiconductor material coaxially disposed in each first region, extending entirely through the body and terminating in the opposed end surfaces of the first region and having two opposed end surfaces, each end surface of the second region being coextensive with a respective end surface of the first region;
   each second region having a predetermined level of concentration of dopant impurity material and a third type conductivity which is opposite to that type conductivity of the first region;
   a P-N junction formed by the abutting surfaces of each pair of first and second regions of opposite type conductivity, the P-N junction extending between and terminating in the opposed major surfaces of the body;
   the predetermined level of concentration of impurity material in each pair of abutting first and second regions of degenerative semiconductor material being of a sufficient value to impart to the P-N junction formed therebetween electrical characteristics of a tunnel diode;
   a first ohmic electrical contact affixed to one of the two opposed end surfaces of a first region;
   a second ohmic electric contact affixed to one of the two opposed end surfaces of an abutting second region which is coextensive with the one end surface of the first region;
   a third ohmic electrical contact affixed to the other of the two opposed end surfaces of the first region;
   a fourth ohmic electrical contact affixed to the other of the two opposed end surfaces of the second region, and
   the semiconductor neuron functions in a manner similar to a biological neuron when a voltage pulse is applied across the P-N junction between the first and second electrical contacts and after a predetermined time delay the applied voltage pulse appears across the P-N junction between the third and the fourth electrical contacts.

2. The semiconductor neuron of claim 1 wherein the semiconductor material of the body is one selected from the group consisting of Ge, Si, GaAs, GaSb and InP.

3. The semiconductor neuron of claim 1 wherein the impurity imparting the second type conductivity and second level of resistivity is one selected from the group consisting of gallium and aluminum.

4. The semiconductor neuron of claim 1 wherein the opposed major surfaces have a preferred (100) planar crystal orientation.

5. The semiconductor neuron of claim 1 wherein the opposed major surfaces have a preferred (111) crystal orientation and the at least one region has an equilateral triangular cross section.

6. The semiconductor neuron of claim 1 wherein the opposed major surfaces have a preferred (110) crystal orientation and the at least one region has a diamond cross section.

7. The semiconductor neuron of claim 2 wherein the semiconductor material is germanium, and the impurity is gallium.

8. The semiconductor neuron of claim 7 wherein the material of the body and the region each has a dopant impurity concentration of greater than $2 \times 10^{19}$ atoms/cm$^3$.

9. The semiconductor neuron of claim 1 or 2 wherein each second region being formed in situ by the migration of a melt of a metal-rich semiconductor material through the body of thermal gradient zone melting at a predetermined elevated temperature along a thermal gradient substantially parallel with the vertical axis of the body and has a predetermined level of concentration of the metal of the melt therein as determined by the solid solubility limit of that metal in that semiconductor material at that predetermined elevated temperature of migration, the metal being distributed substantially uniformly throughout the entire region and comprising a dopant impurity material to impart a third and opposite conductivity thereto than that conductivity of the first region.

10. The semiconductor neuron of claim 9 wherein each first region being formed in situ by the migration of a melt of a metal-rich semiconductor material through the body by thermal gradient zone melting at a predetermined elevated temperature along a vertical axis of the body and has a predetermined level of concentration of the metal of the melt therein as determined by the solid solubility limit of that metal in that semiconductor material at that predetermined elevated temperature of migration, the metal being distributed substantially uniformly throughout the entire region and comprising a dopant impurity material to impart the second conductivity thereto.

* * * * *